(12) United States Patent
Cheng et al.

(10) Patent No.: US 12,729,454 B2
(45) Date of Patent: Sep. 8, 2026

(54) ALUMINUM BONDING WIRE COATED BY PHOTO-CURING POLYMER, PREPARATION METHOD, AND APPLICATION THEREFOR

(71) Applicant: CHINA ACADEMY OF MACHINERY ZHENGZHOU RESEARCH INSTITUTE OF MECHANICAL ENGINEERING CO., LTD., Zhengzhou (CN)

(72) Inventors: Yafang Cheng, Zhengzhou (CN); Sujuan Zhong, Zhengzhou (CN); Jie Liu, Zhengzhou (CN); Peng Guo, Zhengzhou (CN); Yuanyuan Dong, Zhengzhou (CN); Peiyan Li, Zhengzhou (CN)

(73) Assignee: China Academy of Machinery Zhengzhou Research Institute of Mechanical Engineering Co., Ltd., Zhengzhou (CN)

( * ) Notice: Subject to any disclaimer, the term of this patent is extended or adjusted under 35 U.S.C. 154(b) by 0 days.

(21) Appl. No.: 18/957,464

(22) Filed: Nov. 22, 2024

(65) Prior Publication Data

US 2025/0171924 A1 May 29, 2025

(30) Foreign Application Priority Data

Nov. 27, 2023 (CN) ........................ 202311595824.3

(51) Int. Cl.
*H10W 72/50* (2026.01)
*C09D 5/08* (2006.01)
(Continued)

(52) U.S. Cl.
CPC ................ *C25D 11/24* (2013.01); *C09D 5/08* (2013.01); *C25D 11/045* (2013.01); *H10W 72/5524* (2026.01); *H10W 72/555* (2026.01)

(58) Field of Classification Search
None
See application file for complete search history.

(56) References Cited

U.S. PATENT DOCUMENTS 5,396,104 A * 3/1995 Kimura ................ C07D 311/58 257/784
2013/0189497 A1* 7/2013 Mardilovich ....... B81C 1/00031 427/256

(Continued)

FOREIGN PATENT DOCUMENTS

WO WO-2020004260 A1 * 1/2020 ............. C09D 11/06

OTHER PUBLICATIONS

Nakato et al. (WO 2020004260 A1, machine translation). (Year: 2020).*
Riccomando et al. (Materials 2017, 10, 417). (Year: 2017).*

*Primary Examiner* — Wojciech Haske
(74) *Attorney, Agent, or Firm* — Bochner PLLC; Andrew D. Bochner

(57) ABSTRACT

Provided are an aluminum bonding wire coated by a photo-curing polymer, a preparation method, and an application therefor. The aluminum bonding wire coated by the photo-curing polymer includes an aluminum-based material and an anodic aluminum oxide layer coating outside the aluminum-based material, wherein the anodic aluminum oxide layer includes a plurality of closely arrayed alumina micropores, and a photo-curing polymer layer is attached to the interiors of the alumina micropores and the surface of the alumina microporous layer.

14 Claims, 2 Drawing Sheets

(51) Int. Cl.
*C25D 11/04* (2006.01)
*C25D 11/24* (2006.01)

(56) References Cited

U.S. PATENT DOCUMENTS

2015/0197048 A1* 7/2015 Chiang .................. C25D 11/24 428/307.3
2024/0096844 A1* 3/2024 Kneissl .................. H01B 1/023

* cited by examiner

ALUMINUM BONDING WIRE COATED BY PHOTO-CURING POLYMER, PREPARATION METHOD, AND APPLICATION THEREFOR

CROSS-REFERENCE TO RELATED APPLICATION

The present disclosure claims the priority to the Chinese patent application with the filling No. 2023115958243 filed with the Chinese Patent Office on Nov. 27, 2023, and entitled "ALUMINUM BONDING WIRE COATED BY PHOTO-CURING POLYMER, PREPARATION METHOD, AND APPLICATION THEREFOR", the contents of which are incorporated herein by reference in entirety.

TECHNICAL FIELD

The present disclosure relates to the technical field of electronic packaging, and specifically to an aluminum bonding wire coated by a photo-curing polymer, a preparation method, and an application therefor.

BACKGROUND ART

The aluminum bonding wire includes a pure aluminum wire, a silicon aluminum wire, and a magnesium aluminum wire, etc., which are divided into fine aluminum wires and coarse aluminum wires according to the wire diameter. Since the wire diameter of the coarse aluminum wire is usually larger than 100 μm, it has advantages of large overcurrent and flexible bonding. The aluminum wire bonding technology is broadly applied in power semiconductor devices, such as metal oxide semiconductor field effect transistor (MOSFET), insulated-gate bipolar transistor (IGBT), wide-band-gap semiconductor device, and other power devices, and in other fields such as LED digital tube products, and COB surface light source. It is a key to realize the interconnection between the chip and the packaging.

However, the tensile strength and heat resistance of the existing aluminum bonding wire are poorer, and the lead wire is easily sagged or collapsed after bonded, so that the aluminum bonding wire will be failed due to the lap joint.

After the anodizing treatment, the pure aluminum material will form a membrane porous structure on the surface, which is the anodic aluminum oxide (AAO) template. The pore size, pore shape, and pore depth of the porous structure are determined by parameters of the anodic oxidation process, including the electrolyte composition, electrolysis voltage, current, electrolysis duration, temperature, and other comprehensive impacts. Through controlling the process parameters, the alumina porous array regularly arrayed in the shape of honeycomb can be prepared on the surface of the pure aluminum material. Therefore, it has become a relative mature preparation substrate of nanowire arrays, which is widely used for the preparation of a variety of nanowires by deposition in the solution. For example, in "US-20090266411-PREPARATION METHOD FOR PHOTOVOLTAIC WIRE", a semiconductor photovoltaic wire is prepared by using porous aluminum oxide as the template. The inspiration for the present disclosure from this patent is a method of the anodizing treatment for the cylindrical pure aluminum base, but in the past, the preparation of the AAO template was usually carried out on the flat base. The difference between the present disclosure and the patent is that the alumina porous layer in the patent is only taken as a starting growth template for the semiconductor photovoltaic wire, and then it needs to be removed, wherein the nano-photovoltaic wire prepared is the target product of the patent. However, the present disclosure is a surface modification method for the pure aluminum bonded wire or the aluminum alloy bonded wire: anodizing the surface of the aluminum-based bonded wire to prepare a regularly arrayed porous structure firstly; then depositing the prepolymer of the photo-curing polymer into each pore of the porous structure and filling it to make a composite layer; and then forming a surface composite layer combined the alumina porous layer with the photo-curing polymer layer after the photo-curing reaction, which is used to improve the physical and electrical properties of the aluminum-based bonded wire. Compared to the traditional coating or cladding a coating method, this method has a simpler process, and the response is rapid. The photo-curing duration is usually from tenths of a second to tens of seconds, which depends on the thickness of the cured layer; and it has a high curing effect, low energy consumption, and small environmental pollution. Meanwhile, the alumina microporous layer plays effects of fixing and holding on the polymer layer, so that the polymer layer is not easily fallen off and the thickness is uniform and controllable, which plays a small effect on the wire diameter of the aluminum-based bonded wire. Moreover, the polymer usually evaporates completely at 200~300° C., which does not affect the bonding property of the aluminum-based bonded wire and does not affect the solder joint.

The photo-curing technology is a widely used rapid surface treatment technology nowadays with advantages of energy saving, environmental protection, and fast speed, and it is commonly used for the surface treatment on each type of metal or non-metal material and the electronic component in the microelectronics industry.

In view of this, the present disclosure is proposed.

SUMMARY

An object of the present disclosure is to provide an aluminum bonding wire coated by a photo-curing polymer, wherein the aluminum bonding wire coated by the photo-curing polymer has advantages such as a micron-level insulating coating layer and being not easy to have a lap joint failure.

In order to realize the above objects, the present disclosure adopts the following technical solutions.

One aspect of the present disclosure relates to an aluminum bonding wire coated by the photo-curing polymer, including an aluminum-based material and an anodic aluminum oxide layer coating outside the aluminum-based material, wherein the anodic aluminum oxide layer includes a plurality of closely arrayed alumina micropores, and a photo-curing polymer layer is attached to interiors of the alumina micropores and surfaces of the alumina micropores.

The aluminum bonding wire coated by the photo-curing polymer has a better bonding property, which can effectively avoid a short circuit caused by the collapse of the aluminum bonding wire; and the photo-curing polymer layer has a strong bonding ability and is not easy to peel off.

Another aspect of the present disclosure further relates to a preparation method for the aluminum bonding wire coated by the photo-curing polymer, including the following steps:

- anodizing the aluminum-based material in an electrolyte, so that an anodic aluminum oxide layer including a plurality of closely arrayed alumina micropores is formed on an outer wall of the aluminum-based material; and performing photo curing after putting a photo-curing material liquid into the alumina micropores.

The preparation method for the aluminum bonding wire coated by the photo-curing polymer has the advantages of simplicity and high efficiency, wherein the photo-curing polymer layer obtained by the method has the advantages of uniformity, stable bonding, and being not easy to peel off; and the surface of the prepared aluminum bonding wire is polished and uniform, which avoids problems of poorer cleanliness of the oxide layer and the short circuit caused by the wire collapse.

Another aspect of the present disclosure further relates to a lead wire material for electronic packaging, including the aluminum bonding wire coated by the photo-curing polymer or the aluminum bonding wire prepared by the preparation method for the aluminum bonding wire coated by the photo-curing polymer.

Compared with the prior art, the method of the present disclosure includes the following beneficial effects.

(1) The present disclosure provides the aluminum bonding wire coated by the photo-curing polymer, wherein the photo-curing polymer layer is deposited in the alumina micropores of the anodic aluminum oxide layer. The photo-curing polymer layer provides the aluminum bonding wire with the insulating property, and does not affect the bonding property of the aluminum bonding wire, which can effectively avoid the short circuit caused by the collapse of the aluminum bonding wire. A suitable photo-curing material is selected to be decomposed at high temperature during the bonding process, which does not affect the bonding property and the reliability. The photo-curing polymer layer deeply penetrates into the alumina microporous layer, and the photo-curing polymer layer has a stronger bonding ability, which avoids the defect of easy peeling in the conventional plating or coating layer.

(2) The present disclosure provides the preparation method for the aluminum bonding wire coated by the photo-curing polymer, wherein a nanoscale-micropore anodic aluminum oxide layer arranged in arrays will be formed on the surface after the anodic aluminum oxide (AAO) treatment is carried out on the aluminum-based material; then the photo-curing material is deposited into the micropores; and the photo-curing polymer layer on the surface of the aluminum bonding wire is formed after irradiated by the active light such as UV lamps. Compared with the multilayer coating process, this method has the advantages of simplicity and high efficiency. Compared with the electronic plating and chemical plating, the photo-curing polymer layer obtained by this method has the advantages of uniformity, stable bonding, and being not easy to peel off, and the surface of the prepared aluminum bonding wire is polished and uniform, which avoids the problems of poorer cleanliness of the oxide layer and the short circuit caused by the wire collapse.

BRIEF DESCRIPTION OF DRAWINGS

In order to more clearly illustrate the technical solutions in the specific embodiments of the present disclosure or in the prior art, the drawings to be used in the description of the specific embodiments or the prior art will be briefly introduced below. It is obvious that the drawings described below are some embodiments of the present disclosure. For a person of ordinary skill in the art, other drawings can be obtained from these drawings without inventive efforts.

REFERENCE NUMBERS

1—aluminum-based material, 2—tubular cathode, 3—alumina barrier layer, 4—alumina microporous wall, 5—alumina micropore, and 6—photo-curing polymer layer.

DETAILED DESCRIPTION OF EMBODIMENTS

The technical solutions of the present disclosure will be clearly and completely described below in conjunction with the drawings and the specific embodiments. It will be understood by those skilled in the art that the embodiments described below are partial embodiments of the present disclosure and not all of them, and are used only to illustrate the present disclosure, and should not be regarded as a limitation of the scope of the present disclosure. Based on the embodiments in the present disclosure, all other embodiments obtained by a person of ordinary skill in the art without inventive efforts, all fall within the scope of protection of the present disclosure. Where specific conditions are not indicated in the examples, they shall be performed based on the usual conditions or those recommended by manufacturers. The reagents or instruments used without indication of the manufacturers are conventional products that can be purchased commercially.

Figure 2:
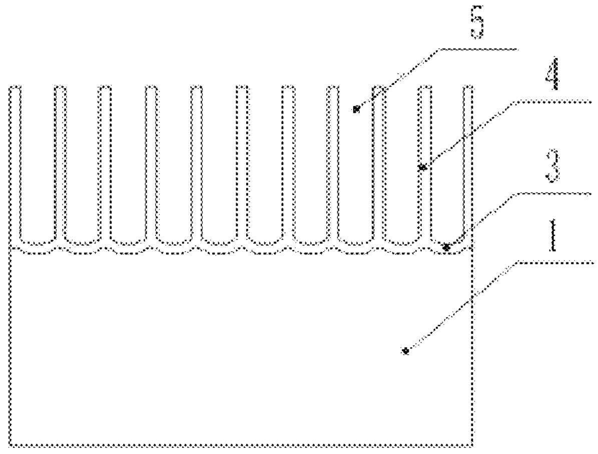
FIG. 2 shows a structure schematic diagram of aluminum bonding wires after anodized.
Figure 3:
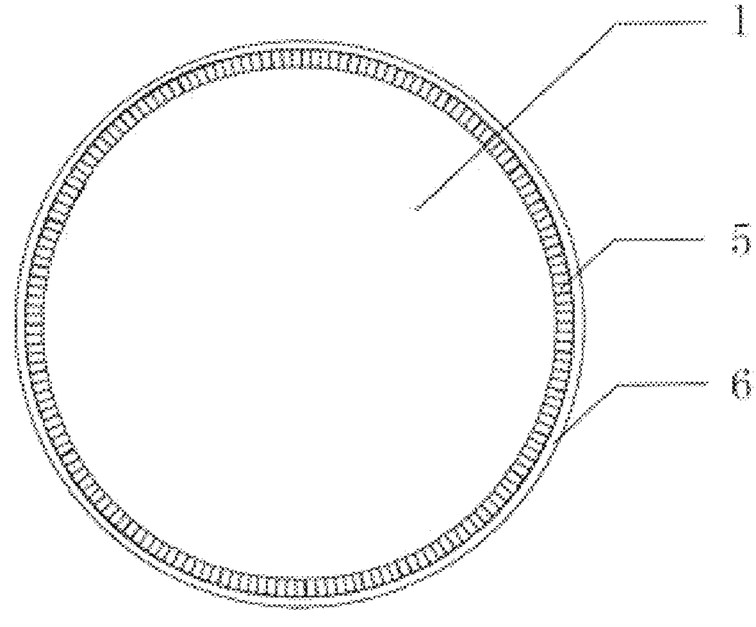
FIG. 3 shows a sectional schematic diagram of aluminum bonding wires after clad by a photo-curing polymer layer.

One aspect of the present disclosure relates to an aluminum bonding wire coated by a photo-curing polymer, as shown in FIG. 2 and FIG. 3, including an aluminum-based material 1 and an anodic aluminum oxide layer coating outside the aluminum-based material 1, wherein the anodic aluminum oxide layer includes a plurality of closely arrayed alumina micropores 5, and a photo-curing polymer layer 6 is attached to interiors of the alumina micropores 5 and surfaces of the alumina micropores 5.

As for the aluminum bonding wire coated by the photo-curing polymer, the photo-curing polymer layer 6 is deposited in the alumina micropores 5 in the anodic aluminum oxide layer, wherein the photo-curing polymer layer 6 provides the aluminum bonding wire with the insulating property, and does not affect the bonding property of the aluminum bonding wire, which can effectively avoid the short circuit caused by the collapse of the aluminum bonding wire. The suitable photo-curing material is selected to be decomposed at high temperature during the bonding process, which does not affect the bonding property and the reliability. The photo-curing polymer layer 6 deeply penetrates the alumina microporous layer, and the photo-curing polymer layer 6 has a stronger bonding ability, which avoids the defect of easy peeling in the conventional plating or coating layer.

The aluminum-based material 1 is treated in a porous anodizing method, i.e., the metal pure aluminum is placed at the anode and anodized in a suitable electrolyte, so that the anodic aluminum oxide layer can be formed on its surface. The bottom of the anodic aluminum oxide layer is a dense alumina barrier layer 3, wherein the upper layer is a thicker porous membrane-cell structure closely arrayed in shape of honeycomb, and its size is in the nanoscale or submicron scale. The pores of the micropores in the anodic aluminum oxide layer are arrayed orderly and distributed uniformly, and the pore channel is perpendicular to the surface of the base, which is a self-organizing process. Multiple types of metals or non-metals can be synthesized or deposited in this pore channel when a reasonable process is designed.

Figure 1:
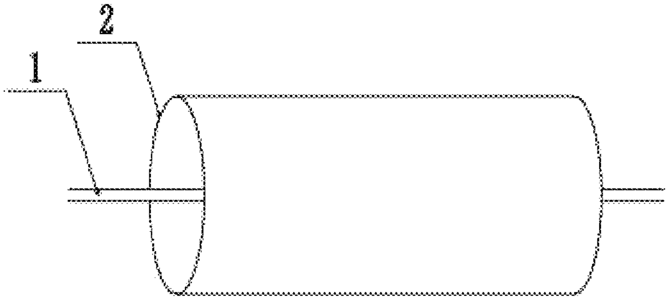
FIG. 1 shows a schematic diagram of a tubular electrode after anodized provided by the embodiments of the present disclosure.

The cathode used in the anodizing process is a tubular cathode 2 surrounding the aluminum-based material 1, wherein the aluminum-based material 1 passes through the tubular cathode 2 from its inner axis position, and is kept at the same distance from the inner surface of the tubular cathode 2, so that a basically uniform electric field is generated on the surface of the aluminum-based material 1, as shown in FIG. 1.

The aluminum-based material 1 is taken as an anode to connect to the tubular cathode 2 and the regulated DC power supply. By regulating the composition and concentration of the electrolyte, current density, temperature, oxidation voltage, and duration, the anodic aluminum oxide layers with different sizes and thicknesses can be obtained.

Regarding the tolerance range of the aluminum wire diameter specified in the standard of "YST 641-2007 aluminum wire for the bonding of the semiconductor component", in order to ensure that the wire is fed smoothly when the aluminum wire is bonded and the subsequent bonding process for the lead wire is successfully completed, the impact of the coating layer on the final wire diameter needs to meet the tolerance requirement in the standard, such as 100 μm±4 μm, 200 μm±6 μm, 375 μm±7 μm, and 500 μm±8 μm.

The advantage of the present disclosure lies in that the aluminum material itself can form a porous oxide film under a special anodizing condition. The pore size, pore depth, and pore shape of the oxide film can be controlled through controlling the process condition, so as to naturally become a template base formed by the coating layer and to form an embedded composite coating bonded firmly, so as to have advantages in uniformity, bonding firmness, and surface quality compared with other methods. Further, during the bonding process, the polymer layer has no residue after volatilized at a high temperature, which does not affect the bonding property at the solder joint; and the surface of the wire material besides the solder joint continues to remain insulated, which avoids the lap joint failure between the wire material.

Further, the photo-curing polymer layer 6 is mainly made of the following components according to part by mass:

80~100 parts of base polymers (such as 80 parts, 85 parts, 90 parts, 95 parts, or 100 parts), 20~50 parts of photo-curing agents (such as 20 parts, 25 parts, 30 parts, 35 parts, 40 parts, 45 parts, or 50 parts), 0.2~0.5 parts of photo-radical initiator (such as 0.2 parts, 0.3 parts, 0.4 parts, or 0.5 parts), and 0.5~1 part of antioxidant (such as 0.5 parts, 0.6 parts, 0.7 parts, 0.8 parts, 0.9 parts, or 1 part).

Further, the base polymer includes: at least one of a photo-curing acrylic prepolymer, a photo-curing silicone prepolymer, or a photo-curing carbamate prepolymer.

Further, the photo-curing acrylic prepolymer includes: at least one of epoxy acrylate, polyurethane acrylate, or polyester acrylate.

Further, the photo-curing silicone prepolymer includes: at least one of vinylated polysiloxane, acrylate-based polysiloxane, epoxy-based polysiloxane, styrene-based polysiloxane, or vinyl ether-based polysiloxane.

Further, the photo-curing carbamate prepolymer includes: polyether carbamate and/or polyester carbamate.

Further, the base polymer has a molecular weight of 1000~5000 (such as 1000, 1500, 2000, 2500, 3000, 3500, 4000, 4500, or 5000), wherein the molecular weight is the molecular weight before the prepolymer is crosslinked.

The base polymer is taken as a solvent before the photo curing to disperse each component and the surface attachments of the wire material; and after photo curing, the reliability of the photo-curing polymer layer 6 is improved by improving the adhesion between the photo-curing polymer layer 6 and the alumina microporous wall 4.

Further, the photo-curing agent needs to be better compatible with the base polymer, wherein the acrylic prepolymer system can be selected from polyfunctional (methyl) acrylate, such as polyethylene glycol dimethacrylate, polypropylene glycol dimethacrylate, and epoxy methacrylate; the photo-curing silicone prepolymer system can be selected from acrylamide or acrylic ester; and the photo-curing carbamate prepolymer system can be selected as the organic amine curing agent, wherein the photo-curing agent preferably has a molecular weight less than 1000, and a functional group equivalent less than 400.

Further, the photo-radical initiator includes: at least one of hydroxyketones such as 2-hydroxy-phenylpropan-1-one photoinitiator, and benzoyl dimethyl ketal; amino ketones such as 2-dimethylamino-2-benzyl-1-(4-morpholinophenyl)-1-butanone photoinitiator; acylphosphine oxides such as trimethylbenzoyl-diphenylphosphine oxide photoinitiator; diphenyl ketones such as 4-(acrylic-2-hydroxypropyl-ester-3-oxy) diphenyl ketone photoinitiator or trichloromethyl triazine-containing derivatives, wherein preferably a maximum wavelength of light absorption is smaller than 405 nm.

The photo-radical initiator is used to generate free radicals when irradiated by the activated light, and to polymerize with the photo-curing agent to generate a polymer layer with a better adhesive ability, so that the photo-curing material adheres to the inner wall of the alumina micropore 5.

Further, the antioxidant includes: at least one of an amine antioxidant, a sulfur antioxidant, a phosphorus antioxidant, or a phenolic antioxidant, preferably the phenolic antioxidant with a hindered phenol structure.

The antioxidant is used to maintain the activity of the photo-radical initiator to improve the efficiency of the photo-curing reaction.

Further, the photo-curing polymer layer 6 includes: acrylic base polymer, polyethylene glycol dimethacrylate, aminoketone photo-radical initiator, and dibutyl hydroxytoluene antioxidant.

Further, the photo-curing polymer layer 6 has a thickness of 2.5~10 μm (such as 2.5 μm, 3 μm, 4 μm, 5 μm, 6 μm, 7 μm, 8 μm, 9 am, or 10 μm). The thickness of the photo-curing polymer layer 6 needs to be controlled within a certain range. The wire diameter will be affected when it is too thick, and the wire material performance during the wire feeding process will also be affected.

Further, the anodic aluminum oxide layer has a thickness of 2~9 μm (such as 2 μm, 3 μm, 4 μm, 5 μm, 6 μm, 7 μm, 8 μm, or 9 μm).

Further, the alumina micropore 5 has a diameter of 80~200 nm (such as 80 mm, 90 mm, 100 mm, 110 mm, 120 mm, 130 mm, 140 mm, 150 mm, 160 mm, 170 mm, 180 mm, 190 mm, or 200 mm).

Further, the aluminum-based material 1 has a wire diameter of 100~500 μm (such as 100 m, 150 μm, 200 μm, 250 μm, 300 μm, 350 μm, 400 μm, 450 μm, or 500 μm).

Further, the aluminum-based material 1 includes: the pure aluminum wire and/or the aluminum alloy wire.

Further, the type model of the aluminum alloy wire is Al-0.5% Mg/Al-0.5% Mg CR.

The pure aluminum wire in the present disclosure has an aluminum content at least 99.99%, and the content of any other element does not exceed the limit values specified below: Fe≤0.003%, Cu≤0.003%, Si≤0.004%, Zn≤0.002%, and the total content of impurities does not exceed 0.01%. The magnesium content in the magnesium-aluminum wire is 0.5%±0.05%, and the total content of impurities does not exceed 0.01%.

Another aspect of the present disclosure further relates to a preparation method for the aluminum bonding wire coated by the photo-curing polymer, including the following steps:

- anodizing the aluminum-based material 1 in the electrolyte, so that the anodic aluminum oxide layer including a plurality of closely arrayed alumina micropores 5 is formed on the outer wall of the aluminum-based material 1; and
- performing the photo curing after putting the photo-curing material liquid into the alumina micropores 5.

In the preparation method for the aluminum bonding wire coated by the photo-curing polymer, a nanoscale-micropore anodic aluminum oxide layer arranged in arrays will be formed on the surface after the anodic aluminum oxide (AAO) treatment is carried out on the aluminum-based material 1; then the photo-curing material is deposited in the micropores; and the photo-curing polymer layer 6 on the surface of the aluminum bonding wire is formed after irradiated by the active light such as UV lamps. Compared with the multilayer coating process, this method has the advantages of simplicity and high efficiency. Compared with the electronic plating and chemical plating, the photo-curing polymer layer 6 obtained by this method has the advantages of uniformity, stable bonding, and being not easy to peel off, and the surface of the prepared aluminum bonding wire is polished and uniform, which avoids the problems of poorer cleanliness of the oxide layer and the short circuit caused by the wire collapse.

Further, the anodizing voltage is 50~100 VDC (such as 50 VDC, 60 VDC, 70 VDC, 80 VDC, 90 VDC, or 100 VDC). The pore size of the porous structure and the degree of order of the anodic oxide layer are positively correlated to the voltage, i.e., the higher the voltage is, the larger the pore size is, the larger the pore growth rate is, and the higher the degree of order is, but there is a reasonable range. If it is too high, the formation and the dissolution processes of the alumina film will have a balance point, so that the linear relationship tends to be slow and become flat, and even the pore will collapse.

Further, a duration of the anodizing is 1~3 min (such as 1 min, 1.5 min, 2 min, 2.5 min, or 3 min).

Further, the electrolyte has a pH<5.

Further, the electrolyte includes, but is not limited to: at least one of sulfuric acid, oxalic acid, and phosphoric acid.

Further, the electrolyte includes: 0.3~0.5 mol/L of oxalic acid, 0.3~0.5 mol/L of phosphoric acid, or 0.3~0.5 mol/L of phosphoric acid-oxalic acid binary system.

Further, a volume ratio of the phosphoric acid and the oxalic acid in the phosphoric acid-oxalic acid binary system is 3~5:1.

Further, the volume ratio of the phosphoric acid and the oxalic acid is 4:1 in the electrolyte of the 0.5 mol/L phosphoric acid-oxalic acid binary system, Further, the temperature of the electrolyte is 10~50° C. (such as 10° C., 20° C., 30° C., 40° C., or 50° C.).

Further, the temperature of the electrolyte is 20° C.

Further, the light source wavelength for the photo curing is 360~450 nm (such as 360 nm, 370 nm, 380 nm, 390 nm, 400 nm, 410 nm, 420 nm, 430 nm, 440 nm, or 450 nm).

Further, the light source for the photo curing includes: UV or other active light sources.

Further, the light source for the photo curing is UV with a wavelength of 365~405 nm.

The process parameters of the preparation method are selected according to the preparation parameter window of the prior AAO template. When the process condition is out of the range, such as the voltage condition or the electrolyte concentration condition, the regularity of the pore obtained will be worse, and the hole will collapse. The best value of the process condition needs to be limited within a certain range for acquiring a regular porous template.

The pore size of the AAO template prepared by oxalic acid as the electrolyte is 40~100 nm, and finally the thicknesses of the alumina layer is 10~60 μm; the pore size of the AAO template prepared by phosphoric acid as the electrolyte is 80~200 nm, and the thicknesses of the alumina layer is 10~50 μm; and the pore size of the AAO template prepared by sulfuric acid as the electrolyte is 10~30 nm, and the thicknesses of the alumina layer is 5~20 μm.

The higher the electrolyte concentration is, the shorter the formation duration of the micropore is, and the faster the growth is; the higher the acid temperature is, the larger the pore size obtained is, but the pore will collapse when the temperature is too high; the higher the voltage is, the higher the growth rate is, the larger the pore size is, and the better the order is; and the longer the oxidation duration is, the thicker the film is, but it has little effect on the pore size. However, if the oxidation duration is too long, the dissolution and generation of the hole will reach a dynamic equilibrium.

The method provided by the present disclosure is applicable to the surface treatment by anodizing for the bonded aluminum strip. It only needs to change the shapes of the anodized cathode and the electrodeposited metal anode to be the sheet shape or the plate shape until they are parallel to the surface of the aluminum strip.

The present disclosure is applicable to the deposition of the surface coating layer of the high-molecular polymer formed by other compositions, and it only needs to adjust compositions of the deposition solution and parameters of the deposition process.

Another aspect of the present disclosure further relates to a lead wire material for electronic packaging, including the aluminum bonding wire coated by the photo-curing polymer or the aluminum bonding wire prepared by the preparation method for the aluminum bonding wire coated by the photo-curing polymer.

The embodiments of the present disclosure will be described in detail below in connection with specific examples and comparative examples.

Example 1

The aluminum bonding wire provided by the example included an aluminum-based material 1 and an anodic aluminum oxide layer coating outside the aluminum-based material 1, wherein the anodic aluminum oxide layer included a plurality of closely arrayed alumina micropores 5, and a photo-curing polymer layer 6 was deposited in the alumina micropores 5, wherein a thickness of the photo-curing polymer layer 6 was 9~10 μm; a thickness of the anodic aluminum oxide layer was 8~9 μm; and a diameter of the alumina micropore 5 was 190~200 nm.

The preparation method for the aluminum bonding wire provided by the example included the following steps:

1, the pure aluminum wire with a wire diameter of 500 μm was soaked in 0.1 mol/L NaOH solution to remove an oxide film and taken as the anode for the anodizing treatment;

2, a lead pipe with a length of 500 mm, an inner diameter of 25 mm, and a wall thickness of 1 mm was selected as the cathode for the anodizing treatment;

3, the anode and cathode were placed in a 0.5 mol/L phosphoric acid electrolyte for the anodizing treatment, and an anodic aluminum oxide layer including the plurality of closely arrayed alumina micropores 5 was formed on the surface of the aluminum wire, wherein a voltage for the anodizing treatment was 100 VDC; a duration for the anodizing treatment was 3 min; and a temperature of the electrolyte was 20° C.;

4, after the anodized pure aluminum wire was cleaned, it was immersed in a deposition tank filling the photo-curing material liquid by an unwinding machine, wherein a length of the deposition tank was 350 mm; a width was 100 mm; a liquid level depth was 40 mm; and an unwinding speed was maintained as 1.5~2.1 m/min, such that the immerse duration of the pure aluminum wire in the photo-curing material liquid was not less than 10s, so that the photo-curing material liquid was adsorbed into the micropores of the anodic aluminum oxide layer, and uniformly adhered to the surface of the wire material, wherein the photo-curing material liquid according to part by mass included: acrylic base polymer 80 parts, polyethylene glycol dimethacrylate photo-curing agent 20 parts, aminoketone photo-radical initiator 0.2 parts, and dibutyl hydroxytoluene antioxidant 0.5 parts; and 5, after removed from the deposition tank, the pure aluminum wire was put into the photo-curing irradiation region for film curing, wherein the UV wavelength of the photo-curing irradiation region was 400 nm; and finally, it was wound by a winding machine.

Example 2

The aluminum bonding wire provided by the example included the aluminum-based material 1 and the anodic aluminum oxide layer coating outside the aluminum-based material 1, wherein the anodic aluminum oxide layer included the plurality of closely arrayed alumina micropores 5, and the photo-curing polymer layer 6 was deposited in the alumina micropores 5, wherein the thickness of the photo-curing polymer layer 6 was 8.5~9.5 μm; the thickness of the anodic aluminum oxide layer was 8~9 μm; and the diameter of the alumina micropore 5 was 160~170 nm.

The preparation method for the aluminum bonding wire provided by the example included the following steps:

1, the pure aluminum wire with a wire diameter of 350 μm was soaked in 0.1 mol/L NaOH solution to remove the oxide film and taken as the anode for the anodizing treatment;

2, the lead pipe with the length of 500 mm, the inner diameter of 25 mm, and the wall thickness of 1 mm was selected as the cathode for the anodizing treatment;

3, the anode and cathode were placed in a 0.5 mol/L phosphoric acid-oxalic acid binary system electrolyte (a volume ratio of phosphoric acid to oxalic acid was 4:1) for the anodizing treatment, and the anodic aluminum oxide layer including the plurality of closely arrayed alumina micropores 5 was formed on the surface of the aluminum wire, wherein the voltage for the anodizing treatment was 100 VDC; the duration for the anodizing treatment was 1.5 min; and the temperature of the electrolyte was 50° C.;

4, after the anodized pure aluminum wire was cleaned, it was immersed in the deposition tank filling the photo-curing material liquid by the unwinding machine, wherein the length of the deposition tank was 350 mm; the width was 100 mm; the liquid level depth was 40 mm; and the unwinding speed was maintained as 1.5~2.1 m/min, such that the immerse duration of the pure aluminum wire in the photo-curing material liquid was not less than 10s, so that the photo-curing material liquid was adsorbed into the micropores of the anodic aluminum oxide layer, and uniformly adhered to the surface of the wire material, wherein the photo-curing material liquid according to part by mass included: the acrylic base polymer 100 parts, the polyethylene glycol dimethacrylate photo-curing agent 50 parts, the aminoketone photo-radical initiator 0.5 parts, and the dibutyl hydroxytoluene antioxidant 1 part; and 5, after removed from the deposition tank, the pure aluminum wire was put into the photo-curing irradiation region for the film curing, wherein the UV wavelength of the photo-curing irradiation region was 375 nm; and finally, it was wound by the winding machine.

Example 3

The aluminum bonding wire provided by the example included the aluminum-based material 1 and the anodic aluminum oxide layer coating outside the aluminum-based material 1, wherein the anodic aluminum oxide layer included the plurality of closely arrayed alumina micropores 5, and the photo-curing polymer layer 6 was deposited in the alumina micropores 5, wherein the thickness of the photo-curing polymer layer 6 was 3.5~5.5 μm; the thickness of the anodic aluminum oxide layer was 3~5 μm; and the diameter of the alumina micropore 5 was 110~120 nm.

The preparation method for the aluminum bonding wire provided by the example included the following steps:

1, the pure aluminum wire with the wire diameter of 500 μm was soaked in the 0.1 mol/L NaOH solution to remove the oxide film and taken as the anode for the anodizing treatment;

2, the lead pipe with the length of 500 mm, the inner diameter of 25 mm, and the wall thickness of 1 mm was selected as the cathode for the anodizing treatment;

3, the anode and cathode were placed in the 0.5 mol/L phosphoric acid-oxalic acid binary system electrolyte (the volume ratio of phosphoric acid to oxalic acid was 4:1) for the anodizing treatment, and the anodic aluminum oxide layer including the plurality of closely arrayed alumina micropores 5 was formed on the surface of the aluminum wire, wherein the voltage for the anodizing treatment was 70 VDC; the duration for the anodizing treatment was 2 min; and the temperature of the electrolyte was 20° C.;

4, after the anodized pure aluminum wire was cleaned, it was immersed in the deposition tank filling the photo-curing material liquid by the unwinding machine, wherein the length of the deposition tank was 350 mm; the width was 100 mm; the liquid level depth was 40 mm; and the unwinding speed was maintained as 1.5~2.1 m/min, such that the immerse duration of the pure aluminum wire in the photo-curing material liquid was not less than 10s, so that the photo-curing material liquid was adsorbed into the micropores of the anodic aluminum oxide layer, and uniformly adhered to the surface of the wire material, wherein the photo-curing material liquid according to part by mass included: the acrylic base polymer 90 parts, the polyethylene glycol dimethacrylate photo-curing agent 40 parts, the aminoketone photo-radical initiator 0.5 parts, and the dibutyl hydroxytoluene antioxidant 1 part; and 5, after removed from the deposition tank, the pure aluminum wire was put into the photo-curing irradiation region for the film curing, wherein the UV wavelength of the photo-curing irradiation region was 450 nm; and finally, it was wound by the winding machine.

Example 4

The aluminum bonding wire provided by the example included the aluminum-based material 1 and the anodic aluminum oxide layer coating outside the aluminum-based material 1, wherein the anodic aluminum oxide layer included the plurality of closely arrayed alumina micropores 5, and the photo-curing polymer layer 6 was deposited in the alumina micropores 5, wherein the thickness of the photo-curing polymer layer 6 was 2.5~3 μm; the thickness of the anodic aluminum oxide layer was 2~2.5 μm; and the diameter of the alumina micropore 5 was 100~110 nm.

The preparation method for the aluminum bonding wire provided by the example included the following steps:

1, the pure aluminum wire with the wire diameter of 100 μm was soaked in the 0.1 mol/L NaOH solution to remove the oxide film and taken as the anode for the anodizing treatment;

2, the lead pipe with the length of 500 mm, the inner diameter of 25 mm, and the wall thickness of 1 mm was selected as the cathode for the anodizing treatment;

3, the anode and cathode were placed in a 0.4 mol/L phosphoric acid electrolyte for the anodizing treatment, and the anodic aluminum oxide layer including the plurality of closely arrayed alumina micropores 5 was formed on the surface of the aluminum wire, wherein the voltage for the anodizing treatment was 70 VDC; the duration for the anodizing treatment was 1 min; and the temperature of the electrolyte was 10° C.;

4, after the anodized pure aluminum wire was cleaned, it was immersed in the deposition tank filling the photo-curing material liquid by the unwinding machine, wherein the length of the deposition tank was 350 mm; the width was 100 mm; the liquid level depth was 40 mm; and the unwinding speed was maintained as 1.5~2.1 m/min, such that the immerse duration of the pure aluminum wire in the photo-curing material liquid was not less than 10s, so that the photo-curing material liquid was adsorbed into the micropores of the anodic aluminum oxide layer, and uniformly adhered to the surface of the wire material, wherein the photo-curing material liquid according to part by mass included: the acrylic base polymer 90 parts, the polyethylene glycol dimethacrylate photo-curing agent 40 parts, the aminoketone photo-radical initiator 0.5 parts, and the dibutyl hydroxytoluene antioxidant 1 part; and 5, after removed from the deposition tank, the pure aluminum wire was put into the photo-curing irradiation region for the film curing, wherein the UV wavelength of the photo-curing irradiation region was 450 nm; and finally, it was wound by the winding machine.

Example 5

The aluminum bonding wire provided by the example included the aluminum-based material 1 and the anodic aluminum oxide layer coating outside the aluminum-based material 1, wherein the anodic aluminum oxide layer included the plurality of closely arrayed alumina micropores 5, and the photo-curing polymer layer 6 was deposited in the alumina micropores 5, wherein the thickness of the photo-curing polymer layer 6 was 2.5~3 μm; the thickness of the anodic aluminum oxide layer was 2~2.5 μm; and the diameter of the alumina micropore 5 was 80~90 nm.

The preparation method for the aluminum bonding wire provided by the example included the following steps:

1, the pure aluminum wire with the wire diameter of 100 μm was soaked in the 0.1 mol/L NaOH solution to remove the oxide film and taken as the anode for the anodizing treatment;

2, the lead pipe with the length of 500 mm, the inner diameter of 25 mm, and the wall thickness of 1 mm was selected as the cathode for the anodizing treatment;

3, the anode and cathode were placed in the 0.4 mol/L phosphoric acid electrolyte for the anodizing treatment, and the anodic aluminum oxide layer including the plurality of closely arrayed alumina micropores 5 was formed on the surface of the aluminum wire, wherein the voltage for the anodizing treatment was 50 VDC; the duration for the anodizing treatment was 1.5 min; and the temperature of the electrolyte was 10° C.;

4, after the anodized pure aluminum wire was cleaned, it was immersed in the deposition tank filling the photo-curing material liquid by the unwinding machine, wherein the length of the deposition tank was 350 mm; the width was 100 mm; the liquid level depth was 40 mm; and the unwinding speed was maintained as 1.5~2.1 m/min, such that the immerse duration of the pure aluminum wire in the photo-curing material liquid was not less than 10s, so that the photo-curing material liquid was adsorbed into the micropores of the anodic aluminum oxide layer, and uniformly adhered to the surface of the wire material, wherein the photo-curing material liquid according to part by mass included: the acrylic base polymer 90 parts, the polyethylene glycol dimethacrylate photo-curing agent 40 parts, the aminoketone photo-radical initiator 0.5 part, and the dibutyl hydroxytoluene antioxidant 1 part; and 5, after removed from the deposition tank, the pure aluminum wire was put into the photo-curing irradiation region for the film curing, wherein the UV wavelength of the photo-curing irradiation region was 450 nm; and finally, it was wound by the winding machine.

Example 6

The example differed from Example 1 only in that the photo-curing layer system included a base polymer of vinylated polysiloxane, a crosslinking agent of sulfhydrylated polysiloxane, and a photoinitiator of acetophenone compound. The thickness of the photo-curing polymer layer 6 of the obtained aluminum bonding wire was 9~10 μm; the thickness of the anodic aluminum oxide layer was 8~9 μm; and the diameter of the alumina micropore 5 was 190~200 nm.

Example 7

The example differed from Example 1 only in that the photo-curing layer system included a base polymer of carbamate polymer, and an ethylenediamine curing agent, and the photoinitiator was 1-hydroxycyclohexyl phenyl ketone or acetophenone. The thickness of the photo-curing polymer layer 6 of the obtained aluminum bonding wire was 9~10 μm; the thickness of the anodic aluminum oxide layer was 8~9 μm; and the diameter of the alumina micropore 5 was 190~200 nm.

Example 8

The example differed from Example 1 only in that a magnesium-aluminum alloy bonded wire with a wire diameter of 375 μm was taken as the aluminum-based material 1. The thickness of the photo-curing polymer layer 6 of the obtained aluminum bonding wire was 9~10 μm; the thickness of the anodic aluminum oxide layer was 8~9 μm; and the diameter of the alumina micropore 5 was 150~190 nm.

Comparative Example 1

The preparation method for the aluminum bonding wire provided by the comparative example differed from Example 1 only in that the step (1), step (2), and step (3) were omitted, and the photo-curing polymer layer 6 was directly clad on the surface of the finished aluminum bonded wire.

Comparative Example 2

The preparation method for the aluminum bonding wire provided by the comparative example differed from Example 1 only in that the surface treatment of the aluminum bonded wire was the anodizing treatment process for the industrial aluminum material, and the electrolyte was sulfuric acid or complex acid; and then the photo-curing polymer layer 6 was clad according to step (4) and step (5). The microporous layer formed on the surface of the aluminum-based material treated by industrial methods usually had different shapes and sizes of the pore sizes, and it was thicker; and after the subsequent cladding of the photo-curing polymer layer 6, the cladding was uneven or some local parts had gaps, which affected its electrical insulating property.

Comparative Example 3

The preparation method for the aluminum bonding wire provided by the comparative example differed from Example 1 only in that the step (4) and step (5) were omitted, wherein the deposition of the photo-curing polymer and the cladding of the photo-curing layer were not carried out within the alumina micropores 5 on the surface of the finished aluminum bonded wire.

Experimental Example

In order to evaluate the performance of the aluminum-based bonded wire treated with the photo-curing polymer cladding, a summary of testing results of each example and comparative example is shown in Table 1.

Since the wire diameter of the bonded wire was thinner, the peel strength test could not be operated, so the aluminum substrate used for testing was a sheet sample with a thickness of 1.5 mm, a width of 15.0±0.1 mm, and a length of 200 mm, and the preparation condition was the same as those in each example. During the sample processing, a part of one end with a length about 20 mm was immersed in the saturated copper chloride solution to dissolve the Al substrate, and only the parts of the alumina layer and the photo-curing polymer layer 6 were preserved for the subsequent peeling test. The test was carried out by using the Shimadzu EZ Test single column electronic mechanical testing machine according to national standard GBT 8808 plastic composite film peeling strength test method, and the electrical resistivity of the wire was tested by using the Tonghui TH2516 DC resistance tester, wherein the electrical resistivity of the pure aluminum wire was calculated as $2.65*10^{-8}\Omega\cdot m$; the electrical resistivity of the magnesium-aluminum wire was calculated as $2.70*10^{-8}\Omega\cdot m$; and the surface resistance of the photo-curing polymer layer 6 was calculated as $2.2\sim3.5*10^{5}\Omega\cdot cm$. It can be concluded that the resistance per meter of the aluminum bonding wire coated by the photo-curing polymer is significantly improved compared to the aluminum bonding wire without cladding (Comparative Example 3); the anodized aluminum bonding wire has a significantly improved bonding ability with the photo-curing polymer layer 6 compared to that of the sample (Comparative Example 1) without surface treatment; and the aluminum bonding wire with a uniform microporous layer has a more uniform surface coating layer than that of the corresponding sample (Comparative Example 2) that was treated in the industrial anodizing method.

TABLE 1

| Test sample | Thickness of alumina layer/μm | Pore size of alumina/nm | Thickness of photo-curing layer/μm | Wire diameter after coating/μm | 180° peeling strength/MPa | Resistance per meter of wire material/Ω · m |
|---|---|---|---|---|---|---|
| Example 1 | 8~9 | 190~200 | 9~10 | 502~505 | 14.3 | $4.25*10^{6}$ |
| Example 2 | 8~9 | 160~170 | 8.5~9.5 | 352~354 | 12.6 | $6.84*10^{6}$ |
| Example 3 | 3~5 | 110~120 | 3.5~5.5 | 501~503 | 9.8 | $2.53*10^{6}$ |
| Example 4 | 2~2.5 | 100~110 | 2.5~3 | 100~102 | 9.6 | $1.08*10^{6}$ |
| Example 5 | 2~2.5 | 80~90 | 2.5~3 | 100~102 | 8.7 | $1.09*10^{6}$ |
| Example 6 | 8~9 | 190~200 | 9~10 | 502~505 | 13.1 | $5.32*10^{6}$ |

TABLE 1-continued

| Test sample | Thickness of alumina layer/μm | Pore size of alumina/nm | Thickness of photo-curing layer/μm | Wire diameter after coating/μm | 180° peeling strength/MPa | Resistance per meter of wire material/Ω · m |
|---|---|---|---|---|---|---|
| Example 7 | 8~9 | 190~200 | 9~10 | 502~505 | 12.5 | $4.59*10^6$ |
| Example 8 | 8~9 | 150~190 | 9~10 | 376~378.5 | 11.9 | $5.64*10^6$ |
| Comparative Example 1 | / | / | 6~8 | 506~508 | 1.7 | $2.36*10^6$ |
| Comparative Example 2 | 18~25 | / | 25~35 | 510~530 | 6.9 | $0.76*10^6$ |
| Comparative Example 3 | 8~9 | 190~200 | / | 501~502 | / | $3.51*10^2$ |

Although the present disclosure has been illustrated and described with the specific embodiments, but it should be realized that each embodiment above is used only to illustrate the technical solutions of the present disclosure and is not a limitation thereof. It should be understood by those of ordinary skill in the art that the technical solutions recorded in the foregoing embodiments may be modified, or partial or all of the technical features therein may be equivalently replaced without departing from the spirit and scope of the present disclosure; and these modifications or replacements do not take the essence of the corresponding technical solutions out of the scope of the technical solutions of the embodiments of the present disclosure. Therefore, it means that all of these replacements and modifications falling within the scope of the present disclosure are included in the appended claims.

The invention claimed is:

1. An aluminum bonding wire coated by a photo-curing polymer, comprising an aluminum-based material and an anodic aluminum oxide layer coating outside the aluminum-based material, wherein the anodic aluminum oxide layer comprises a plurality of closely arrayed alumina micropores, and a photo-curing polymer layer is attached to interiors of the alumina micropores and surfaces of the alumina micropores, wherein the photo-curing polymer layer is made of following components according to part by mass:

base polymers 80-100 parts, photo-curing agents 20-50 parts, photo-radical initiator 0.2-0.5 parts, and anti-oxidant 0.5-1 part.

2. The aluminum bonding wire coated by the photo-curing polymer according to claim 1, wherein the base polymers comprise: at least one of a photo-curing acrylic prepolymer system, a photo-curing silicone prepolymer system, and a photo-curing carbamate prepolymer system.

3. The aluminum bonding wire coated by the photo-curing polymer according to claim 1, wherein a thickness of the photo-curing polymer layer is 2.5-10 μm.

4. The aluminum bonding wire coated by the photo-curing polymer according to claim 1, wherein the aluminum-based material comprises: a pure aluminum wire and/or an aluminum alloy wire.

5. A preparation method for the aluminum bonding wire coated by the photo-curing polymer according to claim 1, comprising following steps:

anodizing the aluminum-based material in an electrolyte, so that the anodic aluminum oxide layer comprising the plurality of closely arrayed alumina micropores is formed on an outer wall of the aluminum-based material; and performing photo curing after putting a photo-curing material liquid into the alumina micropores.

6. The preparation method for the aluminum bonding wire coated by the photo-curing polymer according to claim 5, wherein a duration of the anodizing is 1-3 min.

7. The preparation method for the aluminum bonding wire coated by the photo-curing polymer according to claim 5, wherein a temperature of the electrolyte is 10-50° C.

8. The preparation method for the aluminum bonding wire coated by the photo-curing polymer according to claim 6, wherein a voltage of the anodizing is 50-100 VDC.

9. The preparation method for the aluminum bonding wire coated by the photo-curing polymer according to claim 6, wherein a pH of the electrolyte is $<5$.

10. The preparation method for the aluminum bonding wire coated by the photo-curing polymer according to claim 6, wherein a wavelength of a light source for the photo curing is 360-450 nm.

11. A lead wire material for an electronic packaging, comprising the aluminum bonding wire coated by the photo-curing polymer according to claim 1.

12. The aluminum bonding wire coated by the photo-curing polymer according to claim 1, wherein a thickness of the anodic aluminum oxide layer is 2-9 μm.

13. The aluminum bonding wire coated by the photo-curing polymer according to claim 1, wherein a diameter of the alumina micropores is 80-200 nm.

14. The aluminum bonding wire coated by the photo-curing polymer according to claim 1, wherein a wire diameter of the aluminum-based material is 100-500 μm.

* * * * *